(12) United States Patent
Kurapov et al.

(10) Patent No.: US 8,828,499 B2
(45) Date of Patent: Sep. 9, 2014

(54) USE OF A TARGET FOR SPARK EVAPORATION, AND METHOD FOR PRODUCING A TARGET SUITABLE FOR SAID USE

(75) Inventors: Denis Kurapov, Walenstadt (CH); Markus Lechthaler, Feldkirch (AT)

(73) Assignee: Oerlikon Trading AG, Truebbach, Truebbach (CH)

( * ) Notice: Subject to any disclaimer, the term of this patent is extended or adjusted under 35 U.S.C. 154(b) by 443 days.

(21) Appl. No.: 13/059,257

(22) PCT Filed: Aug. 10, 2009

(86) PCT No.: PCT/EP2009/005803
§ 371 (c)(1),
(2), (4) Date: Feb. 16, 2011

(87) PCT Pub. No.: WO2010/020362
PCT Pub. Date: Feb. 25, 2010

(65) Prior Publication Data
US 2011/0143054 A1    Jun. 16, 2011

(30) Foreign Application Priority Data

Aug. 17, 2008   (EP) .................................... 08014592
Oct. 9, 2008    (EP) .................................... 08017715

(51) Int. Cl.
| | | |
|---|---|---|
| C08F 2/48 | (2006.01) |
| B05D 5/06 | (2006.01) |
| B01D 5/00 | (2006.01) |
| C25B 9/00 | (2006.01) |
| C23C 14/08 | (2006.01) |
| C23C 14/32 | (2006.01) |
| C23C 14/34 | (2006.01) |
| C23C 14/06 | (2006.01) |

(52) U.S. Cl.
CPC ............. *C23C 14/081* (2013.01); *C23C 14/325* (2013.01); *C23C 14/3414* (2013.01); *C23C 14/0641* (2013.01); *H01J 2237/20* (2013.01)
USPC .. 427/508; 427/162; 204/298.41; 204/192.38

(58) Field of Classification Search
USPC ........................................................ 427/580
See application file for complete search history.

(56) References Cited

U.S. PATENT DOCUMENTS 4,232,091 A  *  11/1980  Grimshaw et al. ............. 428/472
4,650,552 A  *   3/1987  de Nora et al. ................ 205/374

(Continued)

FOREIGN PATENT DOCUMENTS

EP        1722003  A1  * 11/2006

OTHER PUBLICATIONS

Ian G. Brown, Cathodic Arc Deposition of Films, 1998, Annu. Rev. Mater. Sci. 28. 243-269.*

(Continued)

*Primary Examiner* — Dah-Wei D Yuan
*Assistant Examiner* — Kristen A Dagenais
(74) *Attorney, Agent, or Firm* — Pearne & Gordon LLP

(57) ABSTRACT

The invention relates to a method for using a target for a coating process of metal oxide and/or metal nitride coatings by means of spark evaporation, wherein the target can be operated at a temperature that is higher than the melting point of the metal used in the target, and wherein the target is comprised of a metal whose oxides and/or nitrides are not electrically conducting. The invention further relates to the use of a target for producing metal oxide coatings and/or metal nitride coatings by means of spark evaporation, wherein the target has a matrix comprised of a metal, in which matrix non electrically conducting oxides and/or nitrides of the metal are embedded.

3 Claims, 1 Drawing Sheet

(56) References Cited

U.S. PATENT DOCUMENTS

| | | | |
|---|---|---|---|
| 4,828,008 A * | 5/1989 | White et al. | 164/66.1 |
| 5,518,597 A | 5/1996 | Storer et al. | |
| 6,033,734 A * | 3/2000 | Muenz et al. | 427/309 |
| 2002/0139662 A1* | 10/2002 | Lee | 204/192.38 |

OTHER PUBLICATIONS

Robert H. Perry and Don W. Green. Perry's Chemical Engineer's Handbook. $7^{th}$ edition (1997). 2-7.*

International Search Report for PCT/EP2009/005803 dated Dec. 7, 2009.

* cited by examiner

USE OF A TARGET FOR SPARK
EVAPORATION, AND METHOD FOR
PRODUCING A TARGET SUITABLE FOR
SAID USE

The invention relates to the use of a target in a coating installation for coating metal oxide and/or metal nitride coatings by means of spark evaporation and a method for producing metal oxide coatings by means of spark evaporation. In particular, the invention relates to the use of targets that comprise at least one metallic component and one ceramic component. The invention is particularly relevant for targets that have aluminum as the low-melting metallic component.

Cathodic arc vaporization is a method established for years that finds application in the coating of tools and components and with which a wide range of metallic layers as well as metal nitrides, metal carbides and metal carbon nitrides are deposited. For all these applications, the targets are the cathode of a spark discharge, operated at low tensions and high currents and with which the target (cathode) material is vaporized. Direct-current voltage supply is used as the easiest and most economical power supply for operating the spark discharges.

More problematic is the production of metal oxides by means of spark evaporation. It is difficult to operate a direct-current spark discharge in oxygen or in an atmosphere containing oxygen, in order to deposit oxidic layers for example on tools or components. In this case, there is a risk that, because the target becomes coated with an insulating layer, the process can barely be controlled anymore.

This leads, on the target, to the electrically conductive zone onto which the spark runs constricting itself and finally to an interruption of the spark discharge.

The production of oxidic layers is described in U.S. Pat. No. 5,518,597, wherein a layer deposition occurs at increased temperatures and wherein the method is based on the fact that the anode is also heated (800° C.-1200° C.) and the reactive gas is not introduced directly at the target. The high anode temperature keeps the anode conductive and enables a stable operation of the spark discharge.

As for the anode, using the cathode at increased temperature should at least achieve a reduction of the problem of target contamination. It is therefore desirable to be able to use in a coating installation a target at a high temperature and in fact preferably at temperatures that lie above the melting point of the metal used in the target.

This can be achieved by using a target that has an increased melting point of the target material, which leads to an increased evaporation enthalpy for the target material. In the state of the art, a technique is known in the production of nitride coatings in which the used target contains both metallic Ti as well as electrically conducting TiN, which results in an increased target melting point. TiN, which is released during evaporation, can be integrated directly into the layer. As TiN is a conducting material, the spark can move about unhindered on the target surface and, because of the target material's increased evaporation enthalpy, the difference of the evaporation enthalpy of the target material and of the "contaminated" target surface is minimized.

It is known also in the production of TiAlN coatings to use an alloy target of titanium and aluminum, to which electrically conducting material of TiN is added in order to raise the melting point. Should the layer also include chromium components, it is possible to use a target to which conducting CrN is also added. According to the state of the art, the material added to the metallic target must fulfill two conditions: on the one hand, the material must conduct electric current and, on the other hand, the material must be a component of the layer to be formed. The nitrides of the metals in the groups IVa, Va, VIa of the periodic system are electrically conducting, whilst those of the other metals are not. This naturally limits considerably the choice of the materials that can be used for this technique. A yet further increase of the melting temperature than is possible with the mentioned materials will therefore prove difficult. Even more serious is the fact that, if the coating to be formed only contains insulating layers, it is not possible to work with raising the melting point according to the state of the art.

In the end, this means that the possibility, described above, of increasing the melting point for Al-targets was not available to date, since both aluminum nitride as well as aluminum oxide are not electrically conducting. The production of non-conducting coatings (e.g. oxide) that comprised only aluminum as metallic component therefore still continues to be difficult.

It is therefore a task of the present invention to propose a method according to which a non-conducting layer with a metallic component can be deposited on a substrate by means of spark evaporation.

According to the invention, a target is used having a matrix comprised of a metal whose nitride and/or oxide is electrically not conducting though the target has a melting point that is raised as compared with the state of the art.

According to the invention, a target is used wherein a non-conducting oxide and/or nitride of the target's metal is integrated in the matrix of the target's metal.

In this respect, non-conducting material is added to the target in such a manner that the surface of the target, as seen macroscopically, is still electrically conducting. This is achieved in that the non-conducting portion is integrated in a matrix of the conducting base material. The conducting matrix lies at the surface in a cohesive network that, if used according to the invention, allows the spark to move about across the target.

According to a preferred embodiment, a target is used wherein non-conducting aluminum oxide particles are integrated in the target's aluminum matrix.

According to a further preferred embodiment, the aluminum oxide particles have a diameter that is smaller than 100 µm, in particular smaller than 50 µm. The non-conducting components are in particular introduced into the target as such small particles that, as seen macroscopically, the target's melting point and the necessary evaporation enthalpy are increased. Furthermore, it should be ensured that the melting range of the spark is limited with a lower melting temperature (e.g. aluminum). This will lead to a reduction of the droplet emission.

Preferably, a target is used that has a percentage of aluminum oxide in the aluminum matrix of less than 70 vol.%.

According to yet a further preferred embodiment, the target used is a powder-metallurgical target.

Alternatively, a target consisting of aluminum oxide powder comprised in aluminum can be used.

According to a further alternative embodiment, a target is used that is produced by means of a holographic structuring method, wherein an aluminum oxide layer is structured in such a way and the grooves forming between the aluminum oxide are filled with aluminum.

It is furthermore preferred if the target used has an aluminum matrix in which non-conducting aluminum nitride particles are integrated.

In the target used, aluminum nitride grains are preferably present essentially in a first grain diameter and aluminum grains essentially in a second grain diameter, where the first grain diameter is greater than the second grain diameter, in particular three times the size of the second grain diameter.

According to yet a further preferred embodiment, the first grain diameter is approximately 120 µm and the second grain diameter is approximately 40 µm.

According to the invention, a target is also provided that can be used for the production of metal oxide coatings and/or metal nitride coatings by means of spark evaporation, where the target has a matrix comprised of a metal in which non electrically conducting oxides and/or nitrides of the metal are embedded.

Preferably, the percentage of the non electrically conducting oxides and/or nitrides in the matrix is less than 70 vol.%.

According to another preferred embodiment, the matrix consists of aluminum in which aluminum oxide or aluminum nitride is embedded.

Hereinafter, the invention will be described in detail on the basis of an example of embodiment with reference to the drawing.

An embodiment of the invention will now be described by way of example on the basis of an aluminum target. Aluminum is a material that has a low melting point. When aluminum oxide is to be produced by means of spark evaporation, target contamination represents a serious problem in the case of an aluminum target in the evaporation conditions that are typically used. The method of increasing the melting point according to the state of the art is, as previously mentioned, not applicable since aluminum oxide forms a very good insulator.

In the inventive method, the target's aluminum oxide particles have a size of approximately 50 µm, or preferably even a diameter of maximum 50 µm, or they should essentially not exceed this diameter in order to be adapted to the typical size of a spark diameter. Because of the higher melting point, the aluminum oxide is not released and the aluminum particles are embedded in the cohesive aluminum matrix. Therefore, the target's melting point, in particular in coating applications, rises as the proportion of aluminum oxide increases by comparison to the aluminum. Admittedly, it became apparent that a concentration of aluminum that is too low will cause the conductivity of the target surface to be too low to allow a stable spark evaporation to occur. Therefore, in the embodiment, a target with a percentage of aluminum oxide lower than 70 vol.% is used.

To produce the target, different methods can be used. According to a first embodiment, the target can be produced by means of a known powder-metallurgical method. In this case, aluminum is ground to a fine powder and aluminum oxide is ground to a fine powder.

Figure 1:
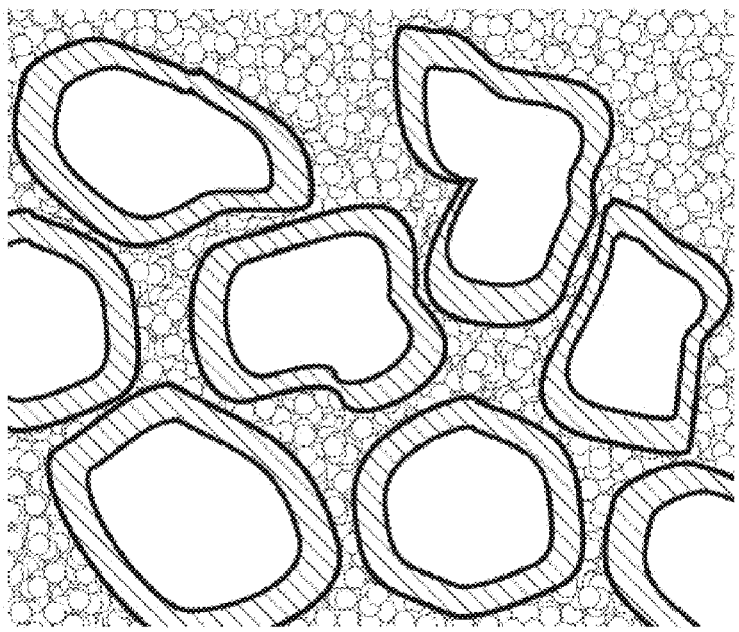
FIG. 1 shows diagrammatically the surface of a target to be used according to the invention with nitrated aluminum grains of approx. 120 µm, embedded in an aluminum environment consisting of aluminum grains smaller by a factor of 3 as "seen" by the spark during spark evaporation.
Figure 2:
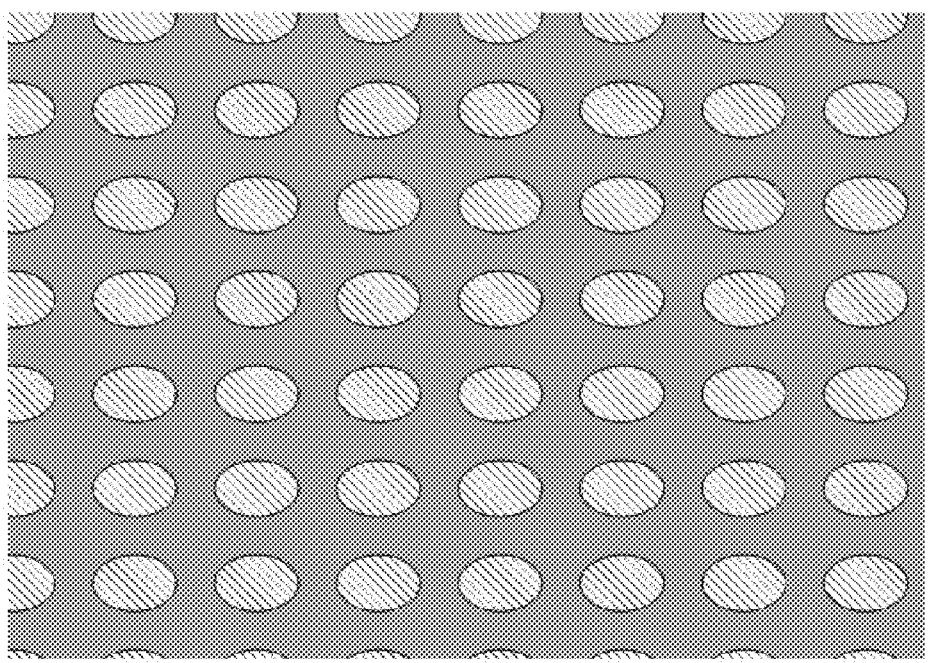
FIG. 2 shows an extract of a target produced according to the invention by means of holographic technology, with a regular arrangement of aluminum oxide islands (shaded), embedded in an aluminum cross-lattice (colored in grey)

According to the inventive method for producing a target, described now in connection with FIG. 2, a holographic structuring method is used, where an aluminum oxide layer is structured in the form of a regular lattice. The grooves that thus form are then filled out with aluminum. The aluminum oxide is preferably structured in two directions x, y, so that regular aluminum oxide island are formed and the aluminum itself as cross lattice allows electrical conductivity in both directions x, y.

Such surface structures can be achieved extensively with a lattice period of some 10 nm to some 10 µm. A lattice period of 500 nm to 20 µm is preferably used, in particular a lattice period of 2 µm is preferably used.

The method described above in connection with an aluminum matrix and aluminum oxide embedded therein can be used on every electrical insulator as long as the latter is embedded in a conducting matrix. The term matrix in this connection is to be interpreted in the widest sense, since the matrix should merely ensure that it can discharge electrical charges, so that the spark fleck can always move about unhindered on a conducting surface.

If a layer is to be formed with AlN components, it is possible for AlN to be embedded in a metallic matrix in the same way and manner as described above. It is furthermore possible to combine the described inventive measure for raising the melting point with the measure known in the state of the art. For example, in order to produce a TiAlN layer by means of spark evaporation, a target can be used in which metallic Ti, metallic Al, the conducting combination TiN and the insulator AlN are integrated as components.

This description should however illustrate a further aspect of the present invention. The one skilled in the art knows that the enrichment of metallic aluminum grains with oxygen causes problems because of the oxide skin which functions as a diffusion barrier.

It is a well-known fact that in the case of aluminum nitride, nitrogen can diffuse several 100 nm in aluminum, i.e. there is sufficient permeability for AlN after formation on the surface so that further nitrogen can diffuse in deeper regions of the aluminum. As is generally known, this is not possible in the case of aluminum oxide: a first, topmost and often merely a few nanometer thick layer of aluminum oxide will already build a strong diffusion barrier for further oxygen so that a further, more in depth oxidation does not occur. This fact, which contributes to the aluminum level being optically stable, has in the present case the negative consequence that not enough aluminum oxide is generated.

According to one embodiment, in order to avoid the problem described above in the coating process when producing coatings containing aluminum that are preferably of oxidic nature, a target is used that comprises particles containing nitride and aluminum embedded and finely distributed in an aluminum matrix. These particles serve to raise the target's melting point that is necessary for reducing the uncontrolled local fusion bonding of metallic, low-melting aluminum that leads to the emission of macro-particles. If oxygen as process gas is then added during the spark evaporation process, it has surprisingly been observed that nitrogen-free aluminum oxide coatings are essentially formed. The AlN possibly dissociates and Al joins with the available oxygen.

According to the inventive coating process, the target's necessary evaporation enthalpy is higher than that of the pure metal, yet narrowly below that of the composite material.

In the frame of the present invention it has been shown that targets of metal can be used for spark evaporation whose nitrides and/or oxides are not electrically conducting, where these nitrides and/or oxides are integrated in the form of fine, non-conducting particles in a matrix 4 of the metal, and that it is possible to use a target having this composite material and with an increased melting point for spark evaporation, wherein the problem of spark constriction or instability can be considerably alleviated if not completely avoided.

What is claimed is:

1. A method of holographically structuring a target suitable for use in a spark evaporation coating process for producing metal oxide coatings, the method comprising:

forming a matrix of aluminum with non-conducting aluminum oxide particles being embedded therein, the embedded particles having a diameter that is less than 100 μm and being configured to raise a melting point of the matrix above a melting point of the aluminum, the forming of the matrix comprising:

structuring a lattice of the particles, the structuring of the lattice comprising forming lattice grooves; and forming a conducting surface of the target, the conducting surface being configured to enable unhindered movement of the spark about the target, the forming of the conducting surface comprising filling the lattice grooves with the aluminum.

2. A method of holographically structuring a target suitable for use in a spark evaporation coating process for producing metal nitride coatings, the method comprising:

forming a matrix of aluminum particles with non-conducting aluminum nitride particles being embedded therein, the embedded particles being configured to raise a melting point of the matrix above a melting point of the aluminum particles, the forming of the matrix comprising:

structuring a lattice of the aluminum nitride particles, the structuring of the lattice comprising forming lattice grooves; and forming a conducting surface of the target, the conducting surface being configured to enable unhindered movement of the spark about the target, the forming of the conducting surface comprising filling the lattice grooves with the aluminum particles.

3. The method of claim 2, wherein the embedded particles have diameters that are about 120 μm and the aluminum particles have diameters that are about 40 μm.

* * * * *